(12) United States Patent
Varnham

(10) Patent No.: US 6,363,034 B1
(45) Date of Patent: Mar. 26, 2002

(54) METHODS AND APPARATUS FOR PHASE ANGLE DEMODULATION

(75) Inventor: Malcolm Paul Varnham, Hampshire (GB)

(73) Assignee: GeoSensor Corporation, St. Guadens Cedex (FR)

( * ) Notice: Subject to any disclaimer, the term of this patent is extended or adjusted under 35 U.S.C. 154(b) by 0 days.

(21) Appl. No.: 09/493,874

(22) Filed: Jan. 28, 2000

(30) Foreign Application Priority Data

Jan. 29, 1999 (GB) ............................................. 9901965

(51) Int. Cl.[7] ................................................. H04R 1/44

(52) U.S. Cl. ........................................................ 367/149

(58) Field of Search ................................. 367/149, 153; 327/3; 250/227.14; 356/477; 385/12, 13

(56) References Cited

U.S. PATENT DOCUMENTS

| | | | |
|---|---|---|---|
| 4,360,272 A | 11/1982 | Schmadel et al. | 356/352 |
| 4,547,869 A * | 10/1985 | Savit | 367/149 |
| 4,632,551 A | 12/1986 | Pavlath | 356/345 |
| 4,836,676 A | 6/1989 | Kim et al. | 356/350 |
| 5,260,975 A * | 11/1993 | Saito | 327/3 |
| 5,380,995 A | 1/1995 | Udd et al. | 250/227 |
| 5,991,026 A | 11/1999 | Kluth et al. | 356/345 |

FOREIGN PATENT DOCUMENTS

GB     2 284 256 B     11/1997

OTHER PUBLICATIONS

James H. Cole, et al., "Synthetic–Heterodyne Interfermometric Demodulation", IEEE Journal of Quantum Electronics, vol. QE–18, No. 4., pp. 694–697, Apr. 1982.

Anthony Dandridge, et al, "Homodyne Demodulation Scheme for Fiber Optic Sensors Using Phase Generated Carrier", IEEE Journal of Quantum Electronics, vol. QE–18, No. 10., pp. 1647–1653, Oct. 1982.

I. Sakai, et al., "Multiplexing fiber–optic sensors by frequency modulation: cross–term consideration", Optics Letters, vol. 11, No. 3., pp. 183–185, Mar. 1986.

(List continued on next page.)

Primary Examiner—Daniel T. Pihulic
(74) Attorney, Agent, or Firm—Reidlaw, L.L.C.; John S. Reid

(57) ABSTRACT

An apparatus for phase angle demodulation. The apparatus functions as a highly-linear angle-modulation demodulator and is particularly useful for seismic streamers comprising very-large arrays of optical hydrophones. The apparatus includes a demodulator and a processor in which the demodulator contains a signal input and a reference input. The apparatus is configured such that a phase modulated signal having a carrier frequency is connected to the signal input, and a reference signal is connected to the reference input. A difference frequency is defined as the non-zero difference in frequency between the reference signal frequency and the carrier frequency. The processor filters the output from the demodulator in order to separate the phase demodulated signal from the difference frequency.

The phase modulated signal can be any form of angle modulated signal such as a Frequency Modulated ("FM") signal, a Phase Modulated ("PM") signal, or a Phase Generated Carrier ("PGC") signal. When demodulating a phase-generated calTier signal, it can be advantageous to combine the output from more than one demodulator each driven by a reference signal with different frequencies from each other. At least one of these reference frequencies is not harmonically related to the fundamental carrier frequency of the phase modulated signal.

13 Claims, 5 Drawing Sheets

OTHER PUBLICATIONS

A. D. Kersey, et al., "Overview of Multiplexing Techniques for Interferometric Fiber Sensors", SPIE, vol. 838, pp. 184–193, Year 1987.

A. Dandridge, et al., "Multiplexing of Interferometric Sensors Using Phase Carrier Techniques", Journal of Lightwave Technology, vol. LT–5, pp. 947–952, Jul. 1987.

J. L. Brooks, "Time–Domain Addressing of Remote Fiber–Optic Interferometric Sensor Arrays", Journal of Lightwave Technology, vol. LT–5, No. 7, pp. 1014–1023, Jul. 1987.

A. D. Kersey, et al., "Time–Division Multiplexing of iNterverometric Fiber Sensors Using Passive Phase–Generated Carrier Interrogation", Optics Letters, vol. 12, No. 10, pp. 775–777, Oct. 1987.

A. D. Kersey, et al., "Distributed and Multiplexed Fibre–Optic Sensor Systems", Journal of the Institution of Electronic and Radio Engineers, vol. 58 No. 5, pp. S99–S111, Jul./Aug. 1988.

C. McGarrity, et l., "A Multiplexing Topology Combining Frequency and Time Division for Fibre–Optic Interferometric Sensors", Technical Paper from the 10th Optical Fibre Sensors Conference, pp. 514–517, No. Date Available.

A. B. Tveten, et al., "Demodulator Optimization for the Interrogation of Fiber Optic Hydrophones in Real World Environments", Technical Paper from the 10th Optical Fibe Sensors Conference, pp. 522–525, No Date Available.

H.S. Al–Raweshidyy, "Hybrid CDMA/WDM Multiplexing Strategy For An Interferometric Optical Fibre Sensor Network", Technical Paper from the 10th Optical Fibre Sensors Conference, pp. 530–533, No Date Available.

* cited by examiner

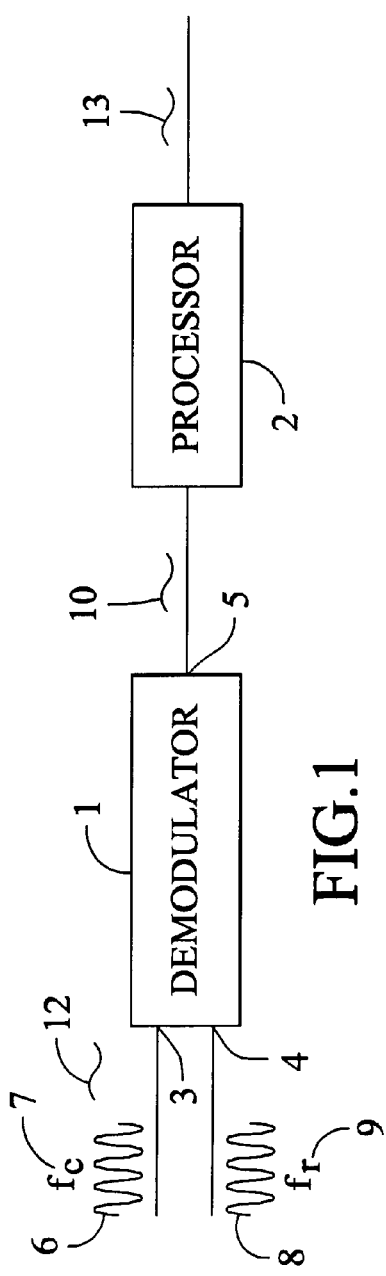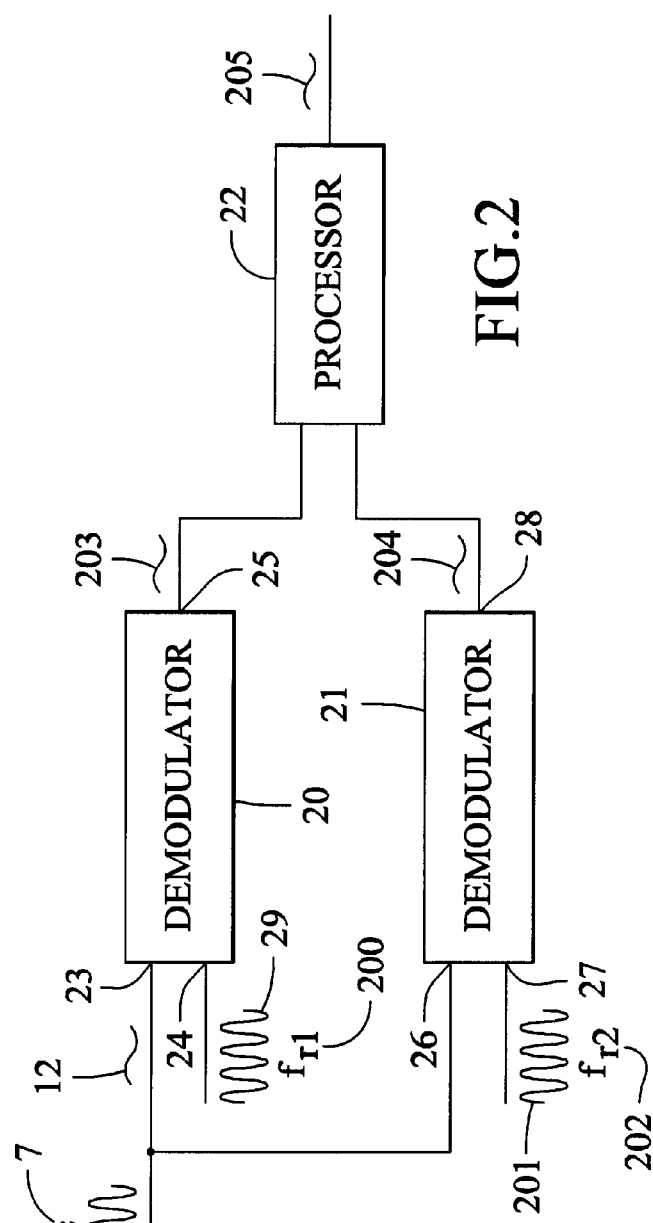

METHODS AND APPARATUS FOR PHASE ANGLE DEMODULATION

CROSS REFERENCE TO RELATED APPLICATIONS

This application claims priority under 35 U.S.C. § 119 to British patent application serial number 9910165.1, filed in the United Kingdom on Apr. 30, 1999.

FIELD OF THE INVENTION

This invention relates to phase angle demodulation apparatus. In particular it relates to a phase angle demodulator with improved linearity particularly suited for demodulating the wide-dynamic range signals typically found in optical hydrophone arrays systems.

BACKGROUND

There is a demand in the oil and gas industry to improve the hit rate of locating recoverable reserves, and for increasing the percentage of oil and gas recovered from reservoirs. This has resulted in the demand for improvements in the quality of seismic surveys and in a demand for in-reservoir fluid-imaging techniques. Both these requirements demand large numbers of sensors networked together.

Streamers based on large arrays of optical hydrophones should preferably be cost-effective compared to conventional electronic arrays. Many hundreds of hydrophones are required in a single streamer and the technical specifications are demanding. In particular, the system must be capable of measuring very-low acoustic signals which are reflected from discontinuities deep within the earth in the presence of the high-level signals resulting from multiple reflections between the sea bed and the air sea interface.

Optical hydrophones convert acoustic information to optical phase information. This is typically impressed upon an optical carrier which is frequency downshifted to an electrical carrier by mixing on a detector. Depending on the specific system architecture, the signal arrives for demodulation as either a Phase Modulated ("PM") signal or a Phase Generated Carrier ("PGC") signal. The process of demodulation in this context refers to the extraction of the impressed phase angle information from the signal output by an optical detector.

A demodulator for geophysical application can have a specification requirement exceeding 120 dB dynamic range where the total harmonic content must be less than 80 dB. The demodulator must therefore be capable of demodulating wide angle signals where the phase deviation covers many cycles. This requirement is difficult and places stringent demands on the linearity of the demodulation process.

SUMMARY OF THE INVENTION

An aim of the present invention is to provide a highly-linear angle-modulation demodulator. This has particular relevance for seismic streamers comprising very-large arrays of optical hydrophones.

Accordingly in one non-limiting embodiment of the present invention, there is provided an apparatus for phase angle demodulation, which apparatus comprises a demodulator and a processor in which the demodulator comprises a signal input, a reference input and a demodulator output that provides an output signal, the apparatus being such that a phase modulated signal having a carrier frequency and a phase modulation is connected to the signal input, a reference signal having a reference signal frequency is connected to the reference input, and in which a difference frequency defined as the difference in frequencies between the reference signal frequency and the carrier frequency is non-zero, and in which the processor filters the output signal.

The phase modulated signal can be any form of angle modulated signal such as a Frequency Modulated ("FM") signal, a Phase Modulated ("PM") signal, or a Phase Generated Carrier ("PGC") signal. When demodulating a phase-generated carrier signal, it can be advantageous to combine the output from more than one demodulator each driven by a reference signal with different frequencies from each other, and where at least one of these reference frequencies is not harmonically related to the fundamental carrier frequency of the phase modulated signal.

In another an embodiment of the present invention, there is provided an apparatus for phase angle demodulation which apparatus comprises a first phase angle demodulator, a second phase angle demodulator, and a processor, in which the first phase angle demodulator comprises a first signal input, a first reference input and a first demodulator output that outputs a first output signal, the second phase angle demodulator comprises a second signal input, a second reference input and a second demodulator output that outputs a second output signal, the apparatus being such that the first demodulator output and the second demodulator output are connected to the processor, the apparatus being such that a phase modulated signal having a carrier frequency and a phase modulation is connected to the first signal input and the second signal input, a first reference signal having a first reference signal frequency is connected to the first reference input, a second reference signal having a second reference signal frequency is connected to the second reference input, and in which at least one of the first reference signal frequency and the second reference signal frequency is different from the carrier frequency, and in which the processor combines and filters the first and second output signals from the first and second phase angle demodulators in order to derive a phase demodulated signal.

The first phase angle demodulator and the second phase angle demodulator can be of the same design. It is preferred that the first reference signal and the second reference signal have a non-zero phase relationship with respect to each other. The non-zero phase relationship is preferably 90 degrees. Alternatively, the first reference signal and the second reference signal can have the same phase, and there can be a phase shift added at the input of either the first phase angle demodulator or the second phase angle demodulator.

The processor resolves phase ambiguities by combining the outputs from the first and second phase angle demodulators to generate a combined signal. The processor can be configured to resolve phase ambiguities by combining the outputs from the first and second phase angle demodulators to generate a combined signal. Preferably, the difference in the carrier frequency and the first and second reference frequencies is substantially greater than the bandwidth of the baseband signal of interest, in which case the processor can filter the combined signal to extract the desired baseband signal.

In another embodiment of the invention, there is provided an apparatus for sensing one or more parameters. The apparatus has at least one transducer which outputs a phase-modulated signal having a carrier frequency and in which the phase modulated signal is demodulated using a phase-angle demodulator according to one of the preceding embodiments. The transducer can be an electronic sensor, a piezoelectric sensor, or any other form of transducer where the resulting signal is a phase-modulated signal. The transducer can also be an optical sensor which can be an interferometer. The transducer can further be an optical fibre sensor which can be an optical fibre interferometer. The optical fibre interferometer can be an optical fibre hydrophone. There can be more than one optical fibre hydrophones configured in an array.

In another embodiment of the invention, there is provided an apparatus for marine seismic surveying comprising light sources, phase modulators, at least one array of optical fibre hydrophones, detectors and phase angle demodulators according to one of the preceding embodiments.

BRIEF DESCRIPTION OF THE DRAWINGS

Embodiments of the invention will now be described solely by way of example and with reference to the accompanying drawings in which:

FIG. 1 depicts a schematic diagram of a phase angle demodulator in accordance with the present invention.

FIG. 2 depicts a schematic diagram of a phase angle demodulator in accordance with the present invention comprising two demodulators whose outputs are combined together.

DETAILED DESCRIPTION OF PREFERRED EMBODIMENTS OF THE PRESENT INVENTION

Figure 3:
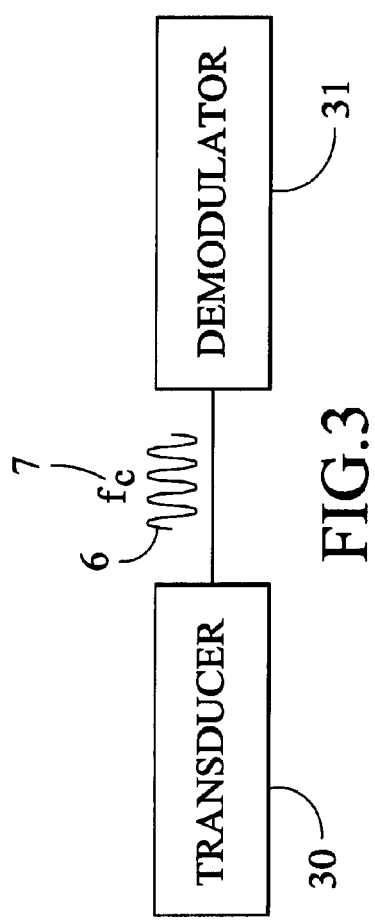
FIG. 3 depicts a schematic diagram of a phase angle demodulator in accordance with the present invention being used to demodulate the output from a transducer.

With reference to FIG. 1, there is provided apparatus in accordance with the present invention for phase angle demodulation, which apparatus comprises a demodulator 1 and a processor 2 in which the demodulator 1 comprises a signal input 3, a reference input 4 and a demodulator output 5 that provides an output signal 10, the apparatus being such that a phase modulated signal 6 having a carrier frequency 7 and a phase modulation 12 is connected to the signal input 3, a reference signal 8 having a reference signal frequency 9 is connected to the reference input 4, and in which a difference frequency (not shown), defined as the difference in frequencies between the reference signal frequency 9 and the carrier frequency 7, is non-zero, and in which the processor 2 filters the output signal 10 from the demodulator output 5 in order to provide an output 13.

The demodulator 1 can be an analogue multiplier, an exclusive "OR" gate, a non-linear circuit containing diodes, a mixer, or any other demodulation circuit that can be configured to demodulate angle modulated signals.

The phase modulated signal 6 can be any form of angle modulated signal such as a Frequency Modulated FM signal, a Phase Modulated PM signal, or a Phase Generated Carrier PGC signal. When demodulating a phase-generated carrier signal, it can be advantageous to combine the output from more than one demodulator each driven by a reference signal with different frequencies from each other, and where at least one of these reference frequencies is not harmonically related to the fundamental carrier frequency of the phase modulated signal.

FIG. 2 shows apparatus in accordance with the present invention for phase angle demodulation which apparatus comprises a first phase angle demodulator 20, a second phase angle demodulator 21, and a processor 22, in which the first phase angle demodulator 20 comprises a first signal input 23, a first reference input 24 and a first demodulator output 25 that outputs a first output signal 203. The second phase angle demodulator 21 comprises a second signal input 26, a second reference input 27 and a second demodulator output 28 that outputs a second output signal 204, the apparatus being configured such that the first demodulator output 25 and the second demodulator output 28 are connected to the processor 22, the apparatus being further configured such that a phase modulated signal 6 having a carrier frequency 7 and a phase modulation 12 is connected to the first signal input 23 and the second signal input 26. A first reference signal 29 having a first reference signal frequency 200 is connected to the first reference input 24, a second reference signal 201 having a second reference signal frequency 202 is connected to the second reference input 27. At least one of the first reference signal frequency 200 and the second reference signal frequency 202 is different from the carrier frequency 7, and the processor 22 combines and filters the first and second output signals 203, 204 from the first and second phase angle demodulators 20, 21 in order to derive a phase demodulated signal 205. The first phase angle demodulator 20 and the second phase angle demodulator 21 can be of the same design whereupon it is preferable that the first reference signal 29 and the second reference signal 201 have a non-zero phase relationship with respect to each other. The non-zero phase relationship can be 90 degrees.

The processor 22 can configured such that it resolves phase ambiguities by combining the outputs from the first and second phase angle demodulators 20 and 21 to generate a combined signal (not shown). Preferably, the difference in the carrier frequency 7 and the first and second reference frequencies 200, 202 is substantially greater than the bandwidth of the phase modulation 12, in which case the processor 22 can provide the necessary filtration of the combined signal to extract the phase demodulated signal 205 that is substantially proportional to the phase modulation 12. The filtration can be a low-pass filter that can be implemented in a digital signal processor.

The processor 22 can be implemented using, analogue electronic circuitry, digital electronic circuitry or a combination of analogue and digital electronic circuitry. Preferably the processor 2 comprises at least one computer such as a digital signal processor in order to combine and filter the first and second output signals 203, 204. A dither signal can be added to the first and second output signals 203, 204 prior to a conversion in an analogue to digital converter.

FIG. 3 shows an apparatus in accordance with the present invention for sensing one or more parameters. The apparatus contains at least one transducer 30 which outputs a phase-modulated signal 6 having a carrier frequency 7. The phase modulated signal 6 is demodulated using the apparatus for phase-angle demodulation 31 shown in either FIG. 1 or 2, and described above. The transducer 30 can be an electronic sensor, a piezoelectric sensor, or any other form of transducer where the resulting signal is a phase-modulated signal. The transducer 30 can also be an optical sensor which can be an interferometer. The transducer 30 can further be an optical fibre sensor which can be an optical fibre interferometer. The optical fibre interferometer can be an optical fibre hydrophone. There can be more than one optical fibre hydrophones configured in an array.

Figure 4:
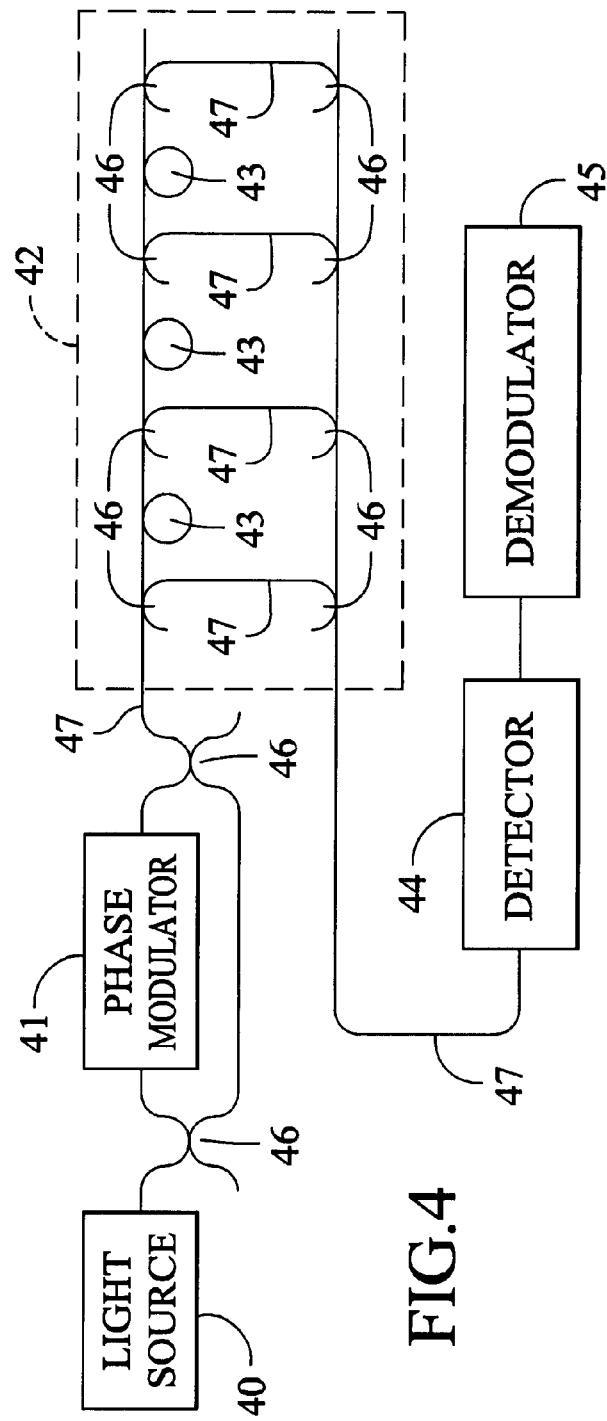
FIG. 4 depicts a schematic diagram of a phase angle demodulator in accordance with the present invention being used to demodulate the output from a sensor array.

FIG. 4 shows apparatus in accordance with the present invention for marine seismic surveying comprising at least one light source 40, at least one phase modulator 41, at least one array 42 of optical fibre hydrophones 43, at least one detector 44, and at least one apparatus for phase angle demodulation 45 of a design similar to that shown in FIG. 1 or 2 and described above. The apparatus is shown in Figs. 4 is connected to optical fibre couplers 46 and optical fibre 47. The individual optical fibre hydrophones 43 can be interrogated separately using wavelength division multiplexing, time division multiplexing, coherence division multiplexing or by a combination of all multiplexing schemes. Optical fibre Bragg gratings can be used to provide wavelength selectivity and to utilise optical wavelength division multiplexing components such as prisms.

Figure 5:
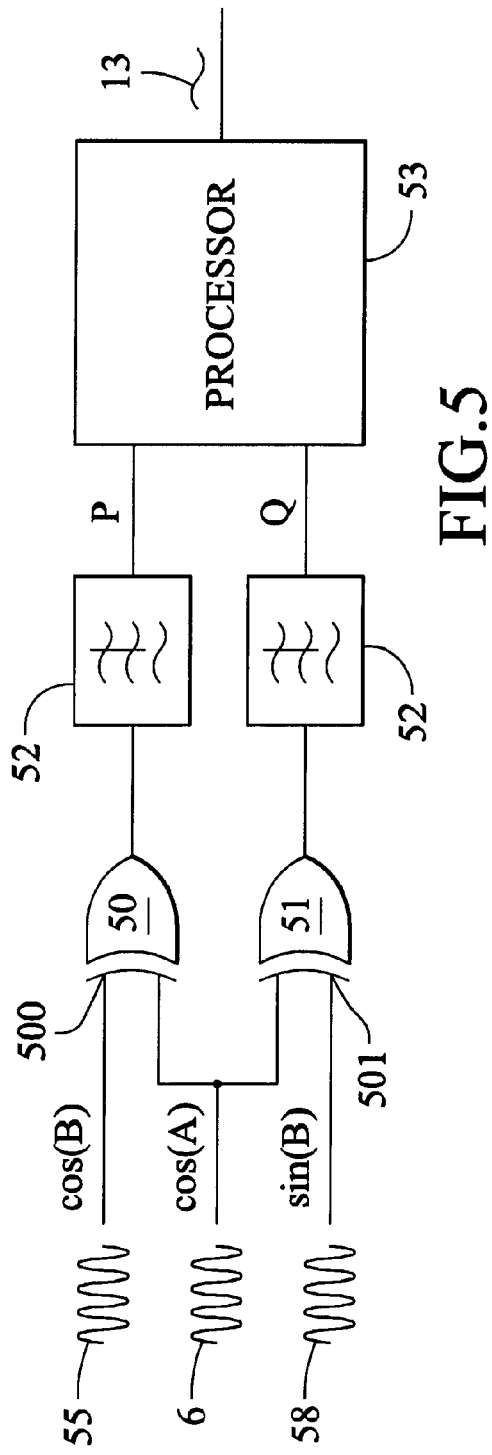
FIG. 5 depicts a schematic diagram of an exclusive-OR-gate demodulator in accordance with the present invention.
Figure 6:
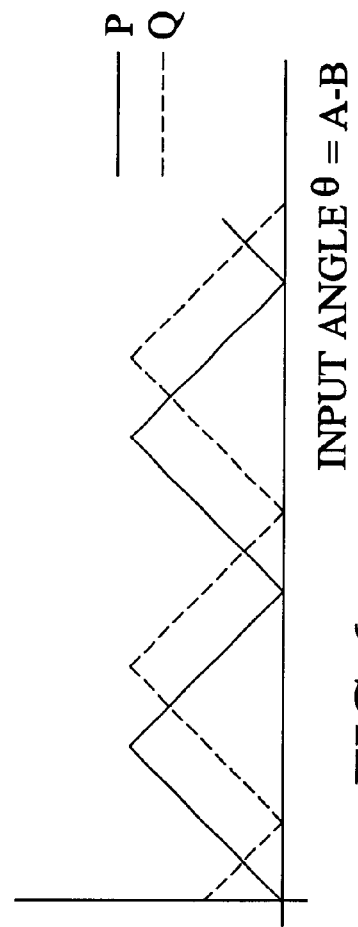
FIG. 6 depicts a graph showing a response from two exclusive-OR-gate demodulators prior to removing phase ambiguities in accordance with the present invention.

FIG. 5 shows a phase angle demodulator in accordance with the present invention comprising first and second exclusive-OR-gate demodulators 50 and 51 having first and second reference inputs 500, 501, low pass filters 52, and a processor 53. The first and second reference inputs 500, 501 are driven in quadrature by first and second reference signals 55 and 58. The phase modulated signal 6 has an instantaneous phase equal to "A" and first and second reference signals 55, 58 have an instantaneous phase equal to "B". The outputs of the first and second exclusive-OR-gate demodulators, after filtering by the filters 52, are "P" and "Q" respectively. The outputs "P" and "Q" as a function of the difference between the instantaneous phase angles "A" and "B" have a triangular dependence as shown in FIG. 6. The dependence is periodic and there is a phase ambiguity in the response. It is generally not possible to know the difference between the instantaneous phase angles "A" and "B" given a single value of "P" and "Q".

The function of the processor 53 is to combine the two outputs "P" and "Q" in order to remove the phase ambiguity thus providing an output that is proportional to the difference between the instantaneous phase angles "A" and "B". This can be accomplished by carrying out quadrant detection on any instantaneous value of "P" and "Q" and then comparing the instantaneous phase output with the previous phase output and adding in cycles as appropriate. The approach is analogous to removing phase ambiguities signals with a sinusoidal dependence on input angle. Here the phase angle θ can be recovered by taking the arctangent of a signal proportional to sin(θ) and a signal proportional to cos(θ) using the ATAN2 function common in many computer languages such as the language known as "C". The result is a phase angle θ that has ambiguities every 360 degrees. If the angle θ is recorded in the processor and then the next reading of θ compared to the last value, then it is possible to remove the 360 degree ambiguity by ensuring that the sample rate is sufficiently high that the angle θ cannot have changed by more than +/-180 degrees between samples. Thus if the previous value were 350 degrees and the new value is 10 degrees, the assumption would be made that the value of 10 degrees should have been 370 degrees—that is one whole cycle greater.

Practical demodulators in accordance with the present invention contain a non-linearity which is periodic with θ—i.e., the demodulator output will be the same for a given phase-angle difference between the signal and reference arms if either the signal or the reference changes its input phase by multiples of 2π radians.

Figure 7:
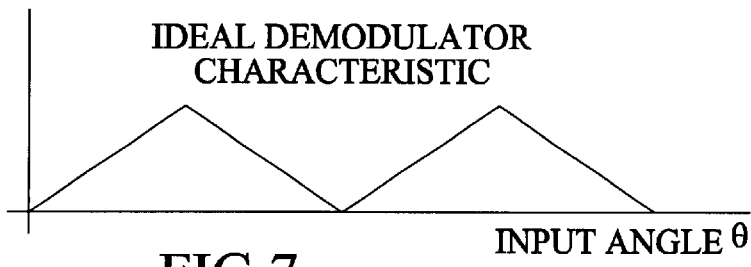
FIG. 7 depicts a graph showing an ideal demodulator characteristic prior to removing phase ambiguities in accordance with the present invention.

FIG. 7 shows a periodic demodulator characteristic produced by a demodulator in accordance with the present invention, in which the characteristic is periodic with respect to the input angle. It is an ideal response with no non-linearity.

Figure 8:
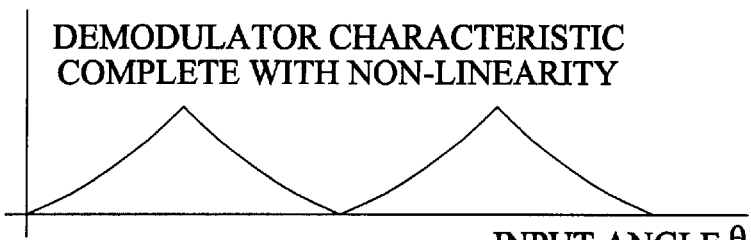
FIG. 8 depicts a graph showing a non-ideal demodulator characteristic prior to removing phase ambiguities in accordance with the present invention.
Figure 9:
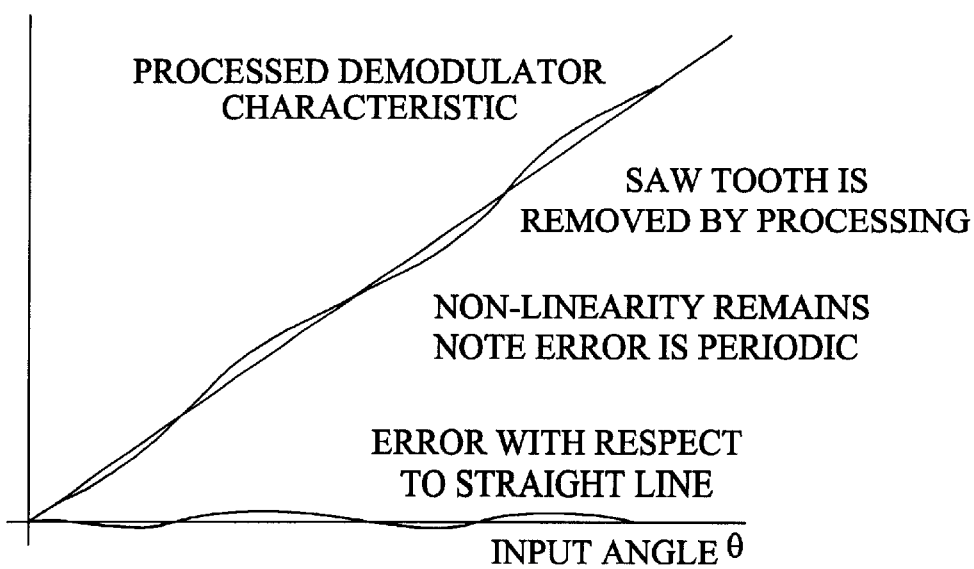
FIG. 9 depicts a graph showing non-linearity errors from a demodulator characteristic after removing phase ambiguities in accordance with the present invention.

A non-linear demodulator characteristic is shown in FIG. 8. Note that the nonlinearity is periodic with respect to input angle. This non-linearity will distort the processed demodulator characteristic as shown in FIG. 9. FIG. 9 also shows the error with respect to the straight line, where the straight line is the ideal demodulator characteristic. After removal of the phase-ambiguity by the processor 53, the ideal response is y=θ.

Periodic functions can be represented by a Fourier Series. Thus an exact expression for the output of the demodulator is given by:

$$y = \theta + \sum_n a_n \cos(n\theta) + \sum_n b_n \sin(n\theta)$$

where the $a_n$ and $b_n$ are the usual Fourier Series coefficients.

If the demodulator is used to demodulate a phase input signal φ(t), then the output of the demodulator is found by substituting for θ. Thus if the input phase A=$\omega_c$t+φ(t) and the reference phase B=$\omega_c$t, then the phase difference θ is given by θ=A−B=φ(t), and $$y = \phi(t) + \sum_n a_n \cos(n\phi(t)) + \sum_n b_n \sin(n\phi(t)).$$

Given that the desired output is φ(t), the Fourier Series terms represent distortion—i.e., the results of non-linearity in the demodulator. That these lead to harmonic distortion can be proven by substituting for φ(t). Thus by setting φ(t)=cos($\omega_m$t) where $\omega_m$ is the modulation frequency (i.e. the acoustic frequency of the signal of interest), the result is:

$$y = \cos(\omega_m t) + \sum_{n=1} a_n \cos(n \cos(\omega_m t)) + \sum_{n=1} b_n \sin(n \cos(\omega_m t)).$$

The terms in cos(n cos($\omega_m$t)) lead to an infinite sum of infinite Bessel function series. For example, the m=3 term yields the following infinite series:

$a_3\cos(3\cos(\omega_m t))=J_0(6)+J_2(6)\cos(2\omega_m t)+J_4(6)\cos(4\omega_m t)+J_6(6)\cos(6\omega_m t)+$ This term leads to even harmonics of $\omega_m$ appearing in the output signal.

It is desirable then to have a system solution to the problem of reducing, or preferably eliminating, the harmonic distortion in the frequency range of interest which arises as a result of non-linearities in the demodulator. The solution according to the present invention is to offset the frequency shift of the reference signals in FIG. 5 compared to the carrier frequency of the signal. By defining the difference in frequencies as $\omega_d$, i.e., Input Signal cos(A)=cos($\omega_c$t+φ(t)) and
Ref Signal cos(B)=cos($\omega_c$t−$\omega_d$t), then θ=$\omega_d$.t+φ(t).
Thus the output of the demodulator becomes:

$$y = \phi(t) + \sum_{n=1}^{\infty} a_n \cos(n\omega_d \cdot t + n\phi(t)) + \sum_{n=1}^{\infty} b_n \sin(n\omega_d \cdot t + n\phi(t)) \quad 5$$

The Fourier terms in the above equation represent angle modulation at carrier frequencies equal to n.$\omega_d$.

Figure 10:
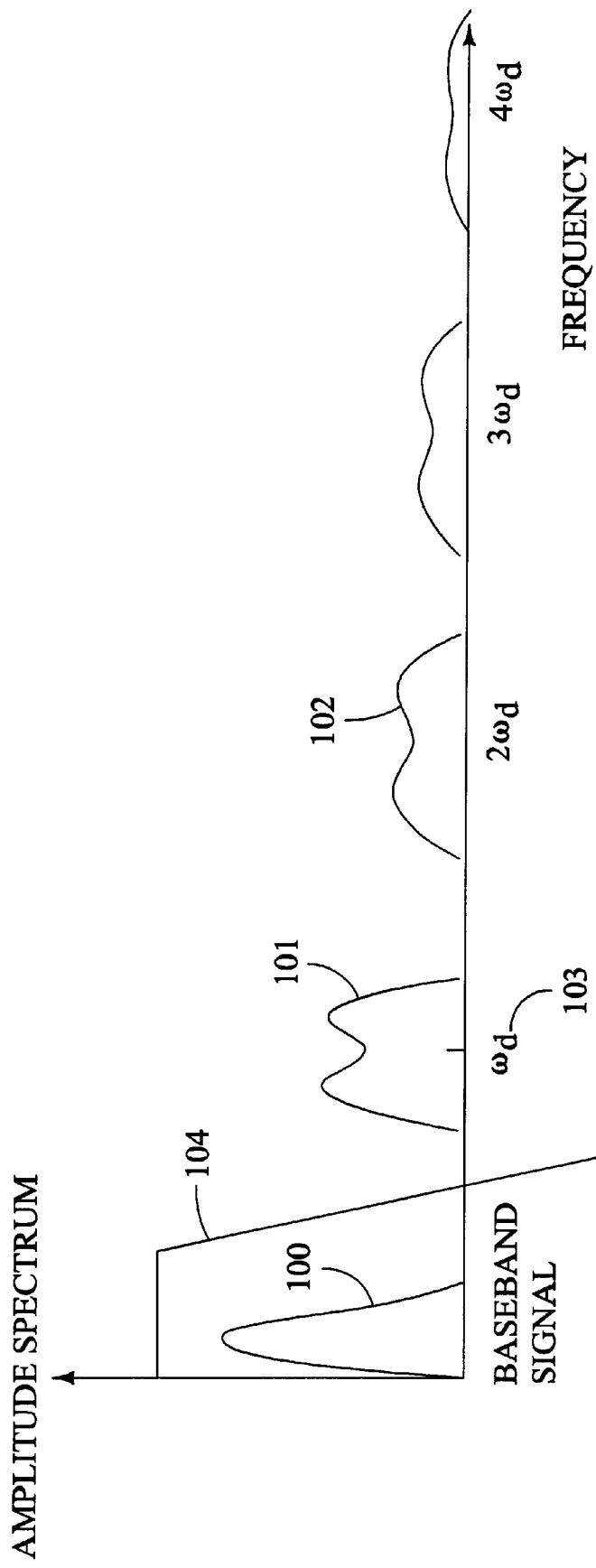
FIG. 10 depicts a graph showing the output spectrum of a demodulated signal resulting from use of a demodulator in accordance with the present invention.

The frequency spectrum of the resulting demodulated signal is shown in FIG. 10. A baseband signal 100 can be separated from angle modulation at $\omega_d$ 101 and angle modulation at 2$\omega_d$ 102 by choosing the difference frequency 1003 to be high enough and filtering within the processor as indicated by the filter characteristic 104.

In practical systems, the input signal is often sampled and can arrive in pulses with a certain width and repetition frequency. The sampling frequency is thus selected to be sufficiently high in order to prevent aliasing and other effects from ruining the response of the demodulator.

A method in accordance with the invention of improving the linearity of angle demodulation is based upon:
  Providing in-phase and quadrature demodulation of the input signal using frequency shifted reference signals;
  Providing phase ambiguity removal using the phase relationships between the in-phase and quadrature demodulated signals; and
  Providing filtration of the resulting signal in order to remove the unwanted higher-frequency components.

Industrial Applicability

These methods and apparatus find general application in sensing applications, marine seismic applications, communications and other applications requiring high-fidelity demodulation. For example, the method and apparatus can be used for seismic streamers comprising very-large arrays of optical hydrophones. In such an application, it is desirable to reduce the number of signal carriers, which can comprise optical fiber cables. Accordingly, a single optical fiber cable in such a streamer can carry the signals from a large number of hydrophones. The signals from the different hydrophones are distinguished by modulating each hydrophone's signal. In order to determine which signal is associated with which hydrophone, he combined signal must be demodulated when it is received at a point of signal processing.

While the above invention has been described in language more or less specific as to structural and methodical features, it is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. An apparatus for phase angle demodulation comprising a first phase angle demodulator, a second phase angle demodulator, and a processor, and wherein:
  the first phase angle demodulator comprises a first signal input, a first reference input and a first demodulator output configured to outputs a first output signal;
  the second phase angle demodulator comprises a second signal input, a second reference input and a second demodulator output configured to output a second output signal; and
  wherein:
    the first demodulator output and the second demodulator output are connected to the processor;
    a phase modulated signal having a carrier frequency and a phase modulation is connected to the first signal input and the second signal input;
    a first reference signal having a first reference signal frequency is connected to the first reference input;
    a second reference signal having a second reference signal frequency is connected to the second reference input;
    at least one of the first reference signal frequency or the second reference signal frequency is different from the carrier frequency; and
    the processor combines and filters the first and second output signals from the first and second phase angle demodulators in order to derive a phase demodulated signal.

2. The apparatus of claim 1, and wherein:
  the first phase angle demodulator and the second phase angle demodulator are of the same design; and
  the first reference signal and the second reference signal have a non-zero phase relationship with respect to each other.

3. The apparatus of claim 2, and wherein the non-zero phase relationship is 90 degrees.

4. The apparatus of claim 1, and wherein the processor is further configured to resolve phase ambiguities by combining outputs from the first and second phase angle demodulators to generate a combined signal.

5. The apparatus of claim 4, and wherein the difference in the carrier frequency and the first and second reference frequencies is substantially greater than the bandwidth of the phase modulation.

6. The apparatus of claim 5, and wherein the processor is further configured to filter the combined signal.

7. An apparatus for sensing one or more parameters, comprising at least one transducer which outputs a phase-modulated signal having a carrier frequency, and wherein the phase modulated signal is demodulated with a demodulation apparatus, the demodulation apparatus comprising:
  a demodulator and a processor, the demodulator comprising a signal input, a reference input and a demodulator output configured to provide an output signal, and wherein the phase modulated signal having the carrier frequency and a phase modulation is connected to the signal input, a reference signal having a reference signal frequency is connected to the reference input, and wherein a difference frequency, defined as the difference in frequencies between the reference signal frequency and the carrier frequency, is non-zero, and further wherein the processor is configured to filter the output signal.

8. The apparatus of claim 7, and wherein the transducer is an optical sensor.

9. The apparatus of claim 8, and wherein the transducer is an interferometer.

10. The apparatus of claim 7, and wherein the transducer is an optical fibre sensor.

11. The apparatus of claim 10, and wherein the transducer is an optical fibre interferometer.

12. The apparatus of claim 7, and further comprising a plurality of the transducers configured as an array of optical fibre hydrophones.

13. An apparatus for marine seismic surveying, comprising at least one light source, at least one phase modulator, at least one array of optical fibre hydrophones, at least one detector, and at least one phase angle demodulation apparatus, and wherein:
  the phase angle demodulation apparatus comprises a demodulator and a processor, the demodulator comprising a signal input, a reference input and a demodulator output configured to provide an output signal, and wherein a phase modulated signal having a carrier frequency and a phase modulation is connected to the signal input, a reference signal having a reference signal frequency is connected to the reference input, and wherein a difference frequency, defined as the difference in frequencies between the reference signal frequency and the carrier frequency, is non-zero, and further wherein the processor is configured to filter the output signal;

the light source provides a first signal to the phase modulator;

the phase modulator modulates the first signal to produce a modulated signal, which modulated signal is provided to the hydrophones;

the hydrophones are configured to convert the modulated signal into the first input signal in response to detected energy;

the first input signal is sensed by the detector; and the detector provides the input signal to the demodulation apparatus.

* * * * *